US011698427B2

(12) United States Patent
Venkatachari et al.

(10) Patent No.: US 11,698,427 B2
(45) Date of Patent: *Jul. 11, 2023

(54) METHODS AND SYSTEMS FOR ESTIMATING TRANSMIT ATTENUATION FOR A MAGNETIC RESONANCE IMAGING SCAN

(71) Applicant: General Electric Company, Schenectady, NY (US)

(72) Inventors: Anand Kumar Venkatachari, Brookfield, WI (US); Ling Sun, Brookfield, WI (US); Wei Sun, Brookfield, WI (US)

(73) Assignee: General Electric Company, Schenectady, NY (US)

( * ) Notice: Subject to any disclaimer, the term of this patent is extended or adjusted under 35 U.S.C. 154(b) by 49 days.

This patent is subject to a terminal disclaimer.

(21) Appl. No.: 17/499,295

(22) Filed: Oct. 12, 2021

(65) Prior Publication Data

US 2022/0026511 A1  Jan. 27, 2022

Related U.S. Application Data (63) Continuation-in-part of application No. 16/101,199, filed on Aug. 10, 2018, now Pat. No. 11,175,367.

(51) Int. Cl.
| | | |
|---|---|---|
| G01R 33/44 | (2006.01) | |
| G01R 33/54 | (2006.01) | |
| G01R 33/483 | (2006.01) | |
| G01R 33/36 | (2006.01) | |

(52) U.S. Cl.
CPC ....... *G01R 33/443* (2013.01); *G01R 33/3614* (2013.01); *G01R 33/4835* (2013.01); *G01R 33/543* (2013.01)

(58) Field of Classification Search
None
See application file for complete search history.

(56) References Cited

U.S. PATENT DOCUMENTS

| | | | |
|---|---|---|---|
| 2012/0161766 A1* | 6/2012 | Harvey | G01R 33/5612 324/309 |
| 2016/0282438 A1* | 9/2016 | Sun | G01R 33/583 |
| 2019/0146044 A1* | 5/2019 | Mori | G06T 7/0012 600/410 |

\* cited by examiner

*Primary Examiner* — Douglas X Rodriguez (57) ABSTRACT

Various methods and systems are provided for correcting transmit attenuation of an amplifier of a transmit radio frequency (RF) coil for use in a magnetic resonance imaging (MRI) system. In one example, a method includes setting a reference value of transmit attenuation for an amplifier of a transmit radio frequency (RF) coil, acquiring a three-dimensional $B_1$ field map with the transmit attenuation set at the reference value, determining a plurality of mean flip angles for a plurality of slice locations in a pre-scan imaging volume from the $B_1$ field map, determining a transmit attenuation correction value for each of the slice locations based on a prescribed flip angle and the mean flip angle determined for the respective slice location, correcting the reference value of transmit attenuation with the transmit attenuation correction value at each of the slice locations to obtain a final value of transmit attenuation for each of the slice locations, and performing an MRI scan with the transmit attenuation set at the value.

20 Claims, 7 Drawing Sheets

METHODS AND SYSTEMS FOR ESTIMATING TRANSMIT ATTENUATION FOR A MAGNETIC RESONANCE IMAGING SCAN

CROSS REFERENCE TO RELATED APPLICATIONS

This Application is a continuation-in-part of U.S. patent application Ser. No. 16/101,199, filed Aug. 10, 2018, which application is herein incorporated by reference.

FIELD

Embodiments of the subject matter disclosed herein relate to magnetic resonance imaging, and more particularly, to estimating transmit attenuation (or transmit gain) for a magnetic resonance imaging scan.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field B0. When the human body, or part of the human body, is placed in the magnetic field B0, the nuclear spins associated with the hydrogen nuclei in tissue water become polarized, wherein the magnetic moments associated with these spins become preferentially aligned along the direction of the magnetic field $B_0$, resulting in a small net tissue magnetization along that axis. MRI systems also include gradient coils that produce smaller amplitude, spatially-varying magnetic fields with orthogonal axes to spatially encode the magnetic resonance (MR) signal by creating a signature resonance frequency at each location in the body. The hydrogen nuclei are excited by a radio frequency signal at or near the resonance frequency of the hydrogen nuclei, which add energy to the nuclear spin system. As the nuclear spins relax back to their rest energy state, they release the absorbed energy in the form of an RF signal. This RF signal (or MR signal) is detected by one or more RF coil arrays and is transformed into the image using reconstruction algorithms.

The radio frequency signal that is transmitted to add energy to the nuclear spin system (referred to as an RF pulse) generates a high-frequency magnetic field B1. The magnitude of the B1 field may be varied in order to generate a desired flip angle, which is the amount of rotation the net magnetization experiences during the application of the RF pulse. To vary the magnitude of the $B_1$ field, the power output of the transmit RF coil(s) may be varied by adjusting the transmit attenuation (or transmit gain) of the RF coil amplifier.

BRIEF DESCRIPTION

In one embodiment, a method for a magnetic resonance imaging (MRI) system includes setting a reference value of transmit attenuation for an amplifier of a transmit radio frequency (RF) coil, acquiring a three-dimensional $B_1$ field map with the transmit attenuation set at the reference value, determining a plurality of mean flip angles for a plurality of slice locations in a pre-scan imaging volume from the $B_1$ field map, determining a transmit attenuation correction value for each of the slice locations based on a prescribed flip angle and the mean flip angle determined for the respective slice location, correcting the reference value of transmit attenuation with the transmit attenuation correction value at each of the slice locations to obtain a final value of transmit attenuation for each of the slice locations, and performing an MRI scan with the transmit attenuation set at the final value.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

The following description relates to various embodiments for adjusting transmit attenuation (or transmit gain) in an MRI system. During an MRI scan, hydrogen nuclei are excited by a radio frequency (RF) signal at or near the resonance frequency of the hydrogen nuclei to add energy to the nuclear spin system. This RF signal is emitted by a transmit RF coil of the MRI system, which thereby generates a high-frequency magnetic field B 1. The transmit RF signal may be controlled in order to achieve a target flip angle. The flip angle refers to the amount of rotation the net magnetization experiences during the application of the RF pulse. The flip angle may be controlled by varying the magnitude of the $B_1$ field, which is a function of the output voltage and current of the RF amplifier of the transmit RF coil. Thus, the transmit attenuation refers to the amount that the maximum output of the RF amplifier is reduced, or attenuated, in order to output an RF signal that achieves the target flip angle. The RF amplifier output is attenuated by a transmit attenuator (e.g., which may be an interposed circuit) that controls the gain of the RF amplifier so that the commanded current and voltage are sent to the RF coil to generate the desired $B_1$ field. In some embodiments, "transmit gain" is used to describe the gain of the RF amplifier, which is complementary to the transmit attenuation. Although "transmit attenuation" is used in most part of this disclosure, it should be understood that the methods disclosed herein apply to "transmit gain" as well.

The value of transmit attenuation of the RF coil (and thus the B1 field generated by the RF coil at a given power of the RF coil) may be determined during a pre-scan routine prior to initiation of a full imaging scan, as the value of transmit attenuation may vary from patient to patient and anatomy to anatomy due to variation in size, shape, and composition (e.g., fat content, water content, etc.) among patients and different anatomy, which create different electromagnetic loads on the RF coils. The value of transmit attenuation to achieve a desired flip angle may then be set for the full imaging (e.g., the imaging scan where high resolution MR data is obtained to reconstruct one or more images of the imaging subject) accordingly. Prior methods for determining the value of transmit attenuation include a magnitude-based calculation that calculates the area under a curve resulting from the projection of MR signal magnitude (also referred to as strength) of a 2D slice of the imaging subject acquired during the pre-scan to one dimension. However, the magnitude-based method is relatively time-consuming (e.g., 20-30 seconds) to complete because multiple values of transmit attenuation need to be tested. A phase-based method for determining the value of transmit attenuation is based on the Bloch-Siegert shift and includes a one-dimensional phase projection where the amount of phase shift resulting from the application of an off-resonant pulse may be measured (as the amount of the phase shift may depend on the RF pulse magnitude). While this phase-based method is relatively fast, the accuracy of the phase shift estimation relies on a homogenous MR signal magnitude. Thus, if the MR signal strength is inhomogeneous, the method may overestimate (or underestimate) the transmit attenuation, resulting in over or under flip and causing image artifacts.

Thus, according to embodiments disclosed herein, a reference value of transmit attenuation which is predetermined based on RF coil parameters and anatomy to be scanned may be corrected according to a measured mean flip angle (also called actual flip angle). In particular, the reference value of transmit attenuation is set according to a desired (e.g., prescribed or predetermined) flip angle. A $B_1$ field map may be acquired with the RF amplifier set at the reference value during a pre-scan. The actual mean flip angle may then be derived from the $B_1$ field map and a transmit attenuation error (also referred to as a correction value or change in transmit attenuation) may be calculated based on the predetermined and actual mean flip angles. The reference value of transmit attenuation may be corrected by the transmit attenuation error, and a full imaging scan may be carried out with the corrected value of transmit attenuation. By using a 3D or 2D B1 field map instead of a 1D projection, any B1 variation at multiple locations is preserved, thereby increasing the accuracy of the transmit attenuation determination.

Figure 1:
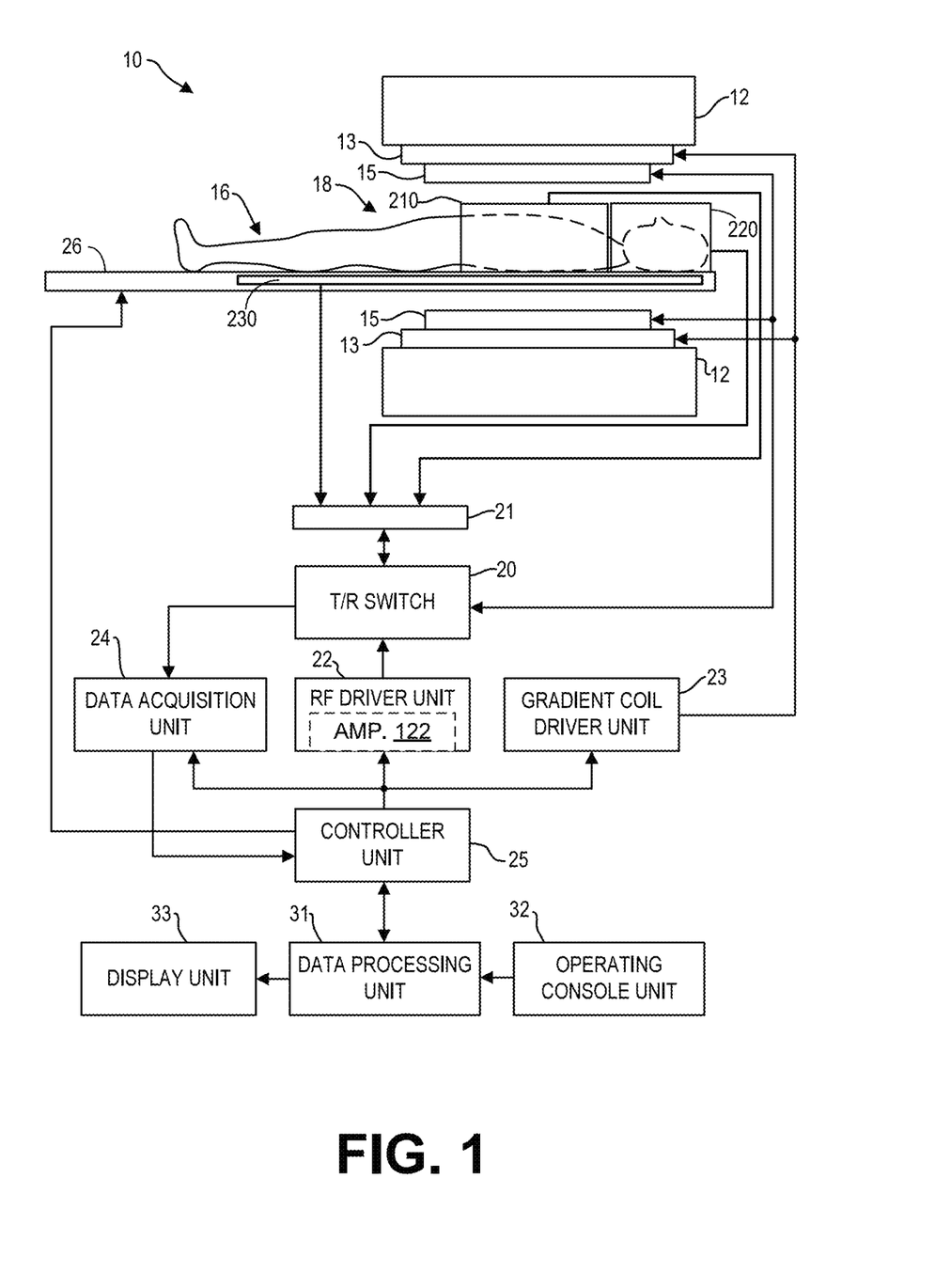
FIG. 1 is a block diagram of an example MRI system.

FIG. 1 illustrates a magnetic resonance imaging (MRI) apparatus 10 that includes a magnetostatic field magnet unit 12, a gradient coil unit 13, one or more local RF coil arrays (210, 220, and 230), an RF body coil unit 15, a transmit/receive (T/R) switch 20, an RF port interface 21, an RF driver unit 22, a gradient coil driver unit 23, a data acquisition unit 24, a controller unit 25, a patient bed 26, a data processing unit 31, an operating console unit 32, and a display unit 33. The MRI apparatus 10 transmits electromagnetic pulse signals to a subject 16 placed in an imaging space 18 with a magnetostatic field formed to perform a scan for obtaining magnetic resonance (MR) signals from the subject 16 to reconstruct an image of the slice of the subject 16 based on the MR signals thus obtained by the scan.

The magnetostatic field magnet unit 12 includes, for example, typically an annular superconducting magnet, which is mounted within a toroidal vacuum vessel. The magnet defines a cylindrical space surrounding the subject 16, and generates a constant primary magnetostatic field $B_0$.

The MRI apparatus 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field which inclines into one of three spatial axes perpendicular to each other, and generates a gradient field in each of a frequency encoding direction, a phase encoding direction, and a slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

Three local RF coil arrays 210, 220, and 230 are shown herein. The local RF coil arrays are disposed, for example, to enclose the region to be imaged of the subject 16. In the static magnetic field space or imaging space 18 where a static magnetic field $B_0$ is formed by the magnetostatic field magnet unit 12, the local RF coil arrays may transmit, based on a control signal from the controller unit 25, an RF pulse that is an electromagnet wave to the subject 16 and thereby generates a high-frequency magnetic field $B_1$. This excites a spin of protons in the slice to be imaged of the subject 16. The local RF coil arrays receive, as a MR signal, the electromagnetic wave generated when the proton spin returns into alignment with the initial magnetization vector. In one embodiment, the local RF coil may transmit and receive an RF pulse using the same local RF coil. In another embodiment, the local RF coil may be used for only receiving the MR signals, but not transmitting the RF pulse.

The RF body coil unit 15 is disposed, for example, to enclose the imaging space 18, and produces RF magnetic field pulses $B_1$ orthogonal to the main magnetic field $B_0$ produced by the magnetostatic field magnet unit 12 within the imaging space 18 to excite the nuclei. In contrast to the local RF coil arrays (such as local RF coil arrays 210 and 220), which may be easily disconnected from the MR apparatus 10 and replaced with another local RF coil, the RF body coil unit 15 is fixedly attached and connected to the MR apparatus 10. Furthermore, whereas coil arrays can transmit to or receive signals from only a localized region of the subject 16, the RF body coil unit 15 generally has a larger coverage area and can be used to transmit or receive signals to the whole body of the subject 16. Using receive-only RF coil arrays and transmit body coils provides a uniform RF excitation and good image uniformity at the expense of high RF power deposited in the subject. For a transmit-receive RF coil array, the coil array provides the RF excitation to the region of interest and receives the MR signal, thereby decreasing the RF power deposited in the subject. It should be appreciated that the particular use of the local RF coil arrays and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect one or more of the local RF coil arrays to the data acquisition unit 24 when the local RF coil arrays operate in receive mode, and to the RF driver unit 22 when operating in transmit mode. When the local RF coil arrays and the RF body coil unit 15 are both used in a single scan, for example if the local RF coil arrays are configured to receive MR signals and the RF body coil unit 15 is configured to transmit RF signals, then the T/R switch 20 may direct control signals from the RF driver unit 22 to the RF body coil unit 15 while directing received MR signals from the local RF coil arrays to the data acquisition unit 24. The RF body coil unit 15 may be configured to operate in a transmit-only mode, a receive-only mode, or a transmit-receive mode. The local RF coil arrays may be configured to operate in a transmit-receive mode or a receive-only mode.

The RF driver unit 22 includes a gate modulator (not shown), an RF power amplifier 122, and an RF oscillator (not shown) that are used to drive the RF coil arrays and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil arrays. As will be described in more detail below, the RF amplifier 122 may be attenuated (e.g., reduce the output voltage and current to the RF coils) by a determined amount in order to create a desired $B_1$ magnetic field.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a preamplifier (not shown), a phase detector (not shown), and an analog/digital converter (not shown) used to acquire the MR signals received by the local RF coil arrays. In the data acquisition unit 24, the phase detector phase detects, using the output from the RF oscillator of the RF driver unit 22 as a reference signal, the MR signals received from the RF coil arrays and amplified by the preamplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25. One or more of the RF coil arrays may be coupled to the table 26 and moved together with the table.

The controller unit 25 includes a computer and a recording medium on which a program to be executed by the computer is recorded, in some embodiments. The program when executed by the computer causes various parts of the apparatus to carry out operations corresponding to predetermined scanning protocols or settings. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

Figure 2:
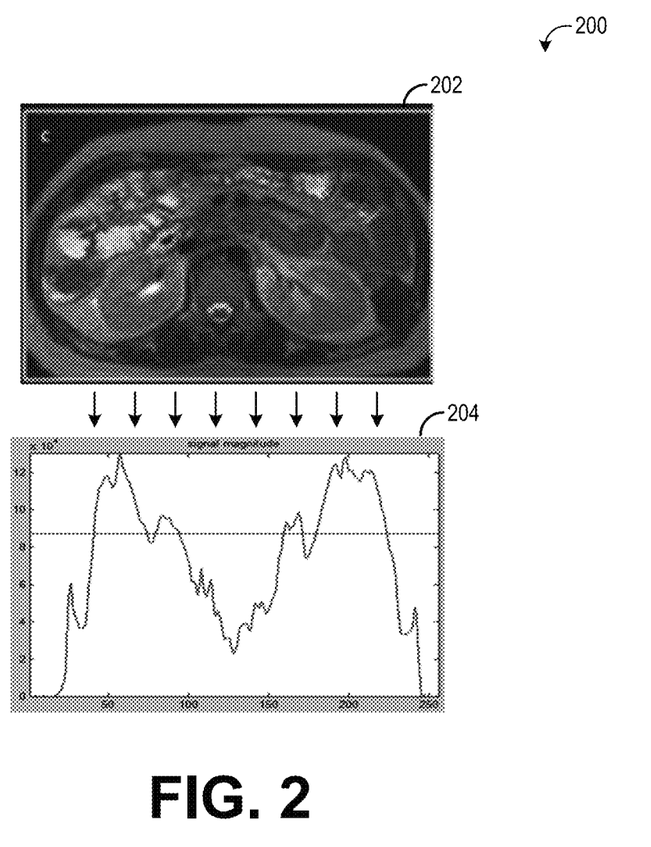
FIG. 2 illustrates a process for estimating transmit attenuation with a magnitude-based method.

As explained previously, the value of transmit attenuation may be determined prior to conducting an imaging scan in order to account for variable electromagnetic loading different patients and different anatomies may provide. A first method for determining the value of transmit attenuation includes a magnitude-based calculation. An example magnitude-based calculation process 200 is shown in FIG. 2. The magnitude-based calculation process 200 includes acquiring a magnitude curve 204 that extends along one dimension (e.g., the medial-lateral axis) of a two-dimensional slice 202 of the imaging subject. Slice 202 is a cross-sectional slice (e.g., taken along a transverse plane). Magnitude curve 204 represents the projection of MR signal magnitude along the medial-lateral axis. The area under the curve 204 is calculated to determine the magnitude of MR signal across the 2D slice 202. The magnitude of MR signal is obtained for multiple values of transmit attenuation before the ideal magnitude is achieved. As such, the magnitude-based method is relatively time-consuming (e.g., taking 20-30 seconds to complete), and thus may be less desirable for time-sensitive imaging protocols.

Figure 3:
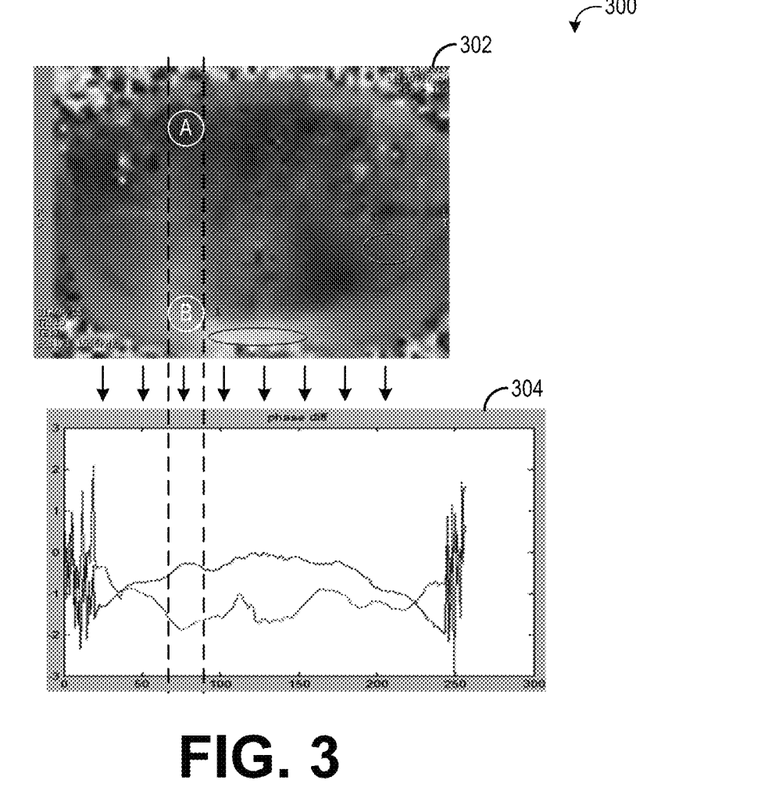
FIG. 3 illustrates a process for estimating transmit attenuation with a phase-based method.

A second method for determining the value of transmit attenuation includes a phase-based calculation. An example phase-based calculation process 300 is shown in FIG. 3. The phase-based calculation process 300 includes acquiring phase curve(s) 304 along one dimension (e.g., the medial-lateral axis) of a 2D slice 302. In FIG. 3, two curves are shown, each corresponding to a channel of the transmit RF coil. Curve(s) 304 represents the projection of phase shift along the medial-lateral axis resulting from the application of an off-resonant pulse. The amount of the phase shift may depend on the RF pulse magnitude. Based on the phase shift obtained from curve(s) 304, the desired value of the transmit attenuation is determined. While this phase-based method is relatively fast, the accuracy of the phase shift estimation using one-dimensional projection relies on a homogenous MR signal magnitude. For example, region A of slice 302 may have a different MR signal strength than region B. When the projection is performed, the MR signal magnitude inhomogeneity may result in the method overestimating (or underestimating) the transmit attenuation.

Figure 4A:
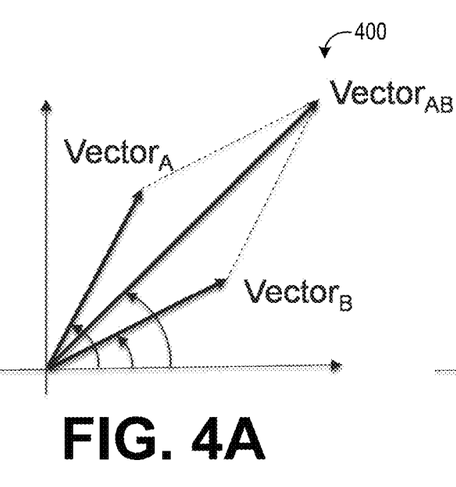
FIGS. 4A and 4B show vector additions performed during a projection of the phase-based method of FIG. 3.
Figure 4B:
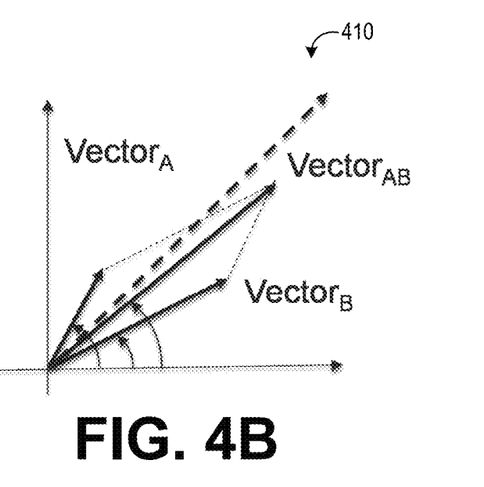

FIG. 4A shows a first vector addition 400 of regions A and B, where the MR signal magnitudes at regions A and B are homogenous, and FIG. 4B shows a second vector addition 410 of regions A and B where regions A and B are not homogenous (such as the example shown in slice 302). If $|Vector_A|=|Vector_B|$, $Phase_{AB}=(Phase_A+Phase_B)/2$, and the projection reflects the average phase shift in this condition. If $|Vector_A|\neq|Vector_B|$, $Phase_{AB}\neq(Phase_A+Phase_B)/2$, and the projection reflects the phase of the averaged vectors (i.e., the solid line in FIG. 4B) but not the average phase shift (i.e., the dashed line in FIG. 4B) in this condition. Thus, the phase shift estimation is not accurate for inhomogeneous MR signal. As will be explained in more detail below, a more accurate estimation of transmit attenuation may be provided by avoiding the phase projection and calculating a mean flip angle directly from the $B_1$ field map.

Figure 5:
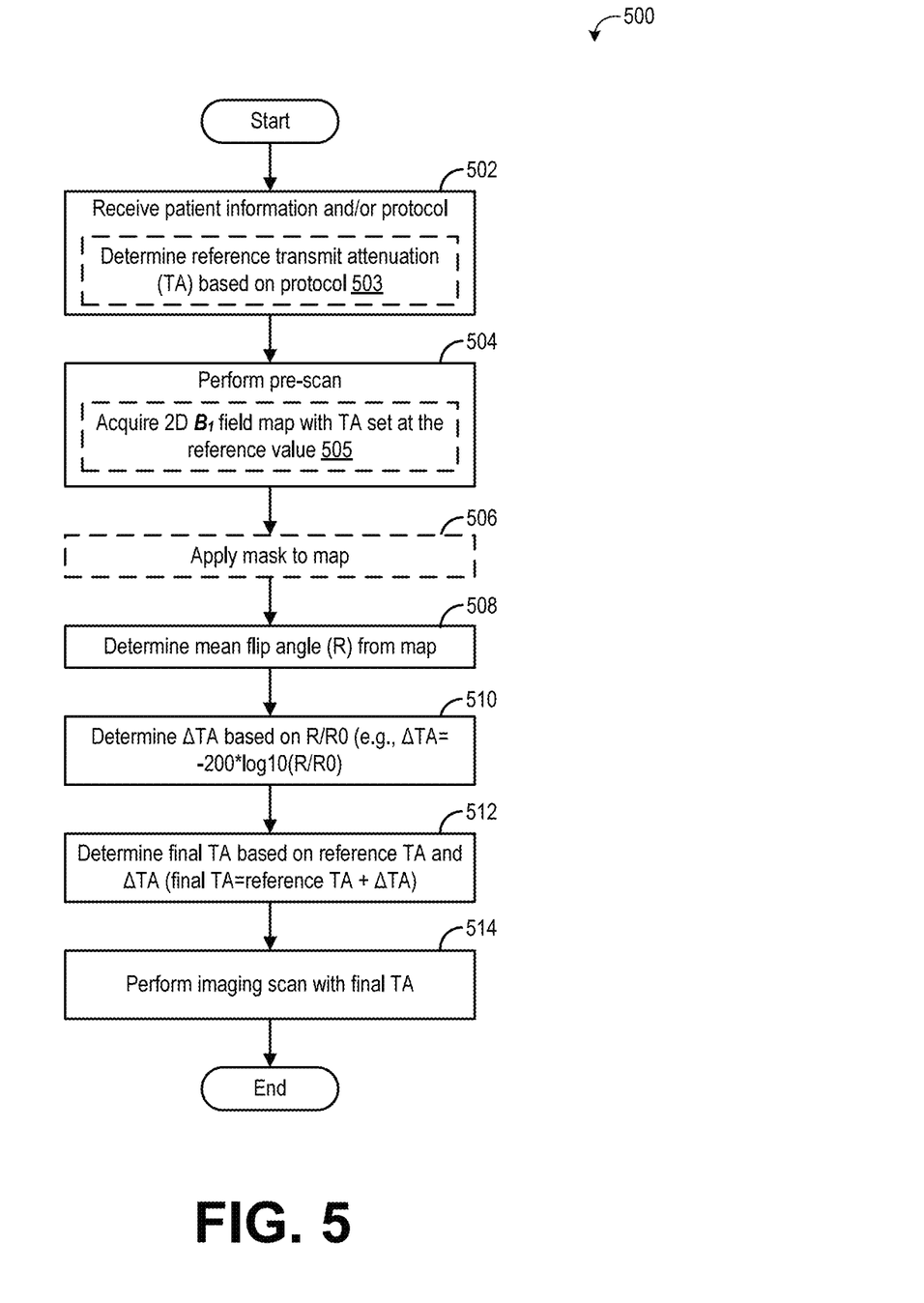
FIG. 5 is a flow chart illustrating a method for correcting transmit attenuation to be applied during an MRI scan.

FIG. 5 is a flow chart illustrating a method 500 for correcting transmit attenuation of an amplifier driving (e.g., providing a desired output current and voltage to) a transmit RF coil, such as amplifier 122 of RF driver unit 22 which drives RF body coil unit 15. Method 500 may be executed by controller unit 25 of FIG. 1 according to instructions stored in non-transitory memory.

At 502, patient information and/or a scanning protocol is received. For example, an operator of the MRI system may input a patient identifier, such as a code or the patient's name, and/or the operator may input select information about the patient (e.g., date of birth, age, gender, body weight). Further, the operator may select a predefined scanning protocol from a menu or the operator may input various scanning parameters to set the scanning protocol. The scanning protocol may indicate the anatomy to be scanned, diagnostic goal of the scan, and/or other parameters that the MRI system may use to identify table position, which receive RF coil arrays are to be used during the scan (e.g., a head and neck RF coil array, posterior RF coil array, and/or anterior RF coil array), and other scanning parameters. In particular, the operator may select the protocol based on the anatomy to be scanned.

Receiving the patient information and/or scanning protocol may include, as indicated at 503, determining a reference value of transmit attenuation (TA) (or transmit gain) based on the scanning protocol and/or patient information. The reference value of TA may define the attenuation to be applied to the amplifier to reduce (e.g., attenuate) the output voltage and current used to drive the transmit RF coil(s) in order to generate a desired $B_1$ magnetic field. By adjusting the output voltage and current supplied to the transmit RF coil(s), the strength of the $B_1$ magnetic field may be adjusted to the desired strength. The desired $B_1$ magnetic field (and hence reference value of TA) may be determined based on the anatomy to be scanned as determined from the scanning protocol and/or patient information, and may be further based on the configuration of the transmit RF coil(s) (e.g., size, number, etc.). The reference value of TA may be obtained from, for example, a look-up table stored in memory of the controller unit, where the look-up table indexes reference TA to anatomy to be scanned or scanning protocol, for example.

At 504, method 500 includes performing a pre-scan. The pre-scan may include activating the MRI system in one or more predetermined sequences in order to obtain data to calibrate various aspects of the MRI system before initiating an imaging scan. The aspects of the MRI system that may be calibrated during the pre-scan may include quick higher-order shimming, coil tuning/matching, center frequency calibration, transmitter gain adjustment, receiver gain adjustment, and dummy cycle stimulation. In some examples, the pre-scan may also include a low-resolution scan of the field of view (FOV) of the MRI system where the acquired image is used to reconstruct an MR image of the FOV to confirm that the desired anatomy is within the FOV. In some examples, this information may be obtained during a separate localizer scan performed before the pre-scan.

Performing the pre-scan includes acquiring a two-dimensional B1 field map with transmit attenuation set at the reference value, as indicated at 505. As mentioned above, the pre-scan may be performed in order to obtain information that is usable to calibrate various aspects of the MRI system, including calibrating the transmit attenuation (or the transmit gain). To calibrate the transmit attenuation (or the transmit gain), a 2D B1 field map is acquired. The 2D B1 field map represents the measured strength of the $B_1$ field in the FOV of the MRI system, for each pixel of a desired plane in imaging space. To acquire the $B_1$ field map, the MRI system may be operated according to a pulse sequence to cause the nuclei in the bore of the imaging system to undergo a Bloch-Siegert shift. In one example, the pulse sequence includes applying a first resonating RF pulse to the plurality of nuclei. A resonating RF pulse is an RF pulse tuned to a resonant frequency of a plurality of nuclei subjected to a magnetic field. As such, the application of a resonating RF pulse places the nuclei in an excited state. The pulse sequence may further include, after application of the first resonating RF pulse, applying a first off-resonance RF pulse to the plurality of excited nuclei. An off-resonance RF pulse is an RF pulse tuned such that that application of the off-resonance RF pulse to a plurality of nuclei does not place the plurality of nuclei in an excited state. For example, an off-resonance RF pulse is an RF pulse having a particular shape or frequency such that the application thereof to a plurality of nuclei subjected to a magnetic field will not be excited, or will be excited to a minimal extent. The application of this first off-resonance RF pulse occurs while the plurality of nuclei are already in an excited state. The application of the first off-resonance RF pulse causes the resonance frequency of the plurality of excited nuclei to shift. Such a shift is often referred to as a Bloch-Siegert shift. The magnitude of such a shift is dependent on the $B_1$ field applied to the plurality of excited nuclei.

After application of the off-resonance RF pulse, a first signal is acquired with the receive RF coils. One or more second resonating RF pulses are then applied, without application of any off-resonance RF pulses. A second signal is acquired with the receive RF coils after application of the second resonating RF pulse. The phase shift may be determined based on a phase difference of the first and second signals, and then the $B_1$ field strength may be determined based on the phase shift.

The 2D B1 field map may be acquired at any desired location and it can be acquired from single or multiple slices of the FOV. In one example, the 2D B1 field map may be acquired at a center-most location of the bore of the MRI system. In another example, the 2D B1 field map may be acquired at a center slice location of the imaging FOV, or other suitable location. In yet another example, the 2D B1 field map may be acquired at an off-center location of the bore of the MRI system based on user prescription.

The 2D B1 field map pulse sequence can be acquired in any suitable plane. The sequence gradients are modified in the X, Y and Z directions to acquire the field map in the desired plane/orientation.

In some examples, method 500 includes optionally, at 506, applying a mask to the $B_1$ field map in order to remove noise. For example, the mask may be circular mask sized, shaped, and positioned to correspond to the bore of the MII system. In this way, any $B_1$ field measured outside the bore (which may correspond to noise) may be removed prior to further processing. In some embodiments, no mask is applied.

Figure 6A:
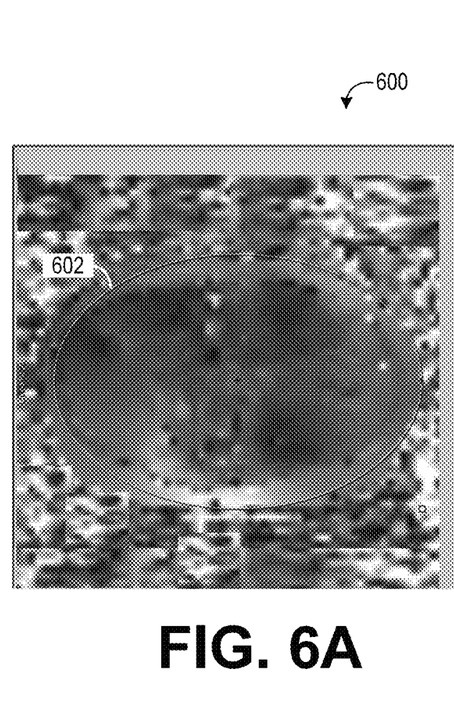
FIG. 6A is an example phase shift map and FIG. 6B is an example $B_1$ field map.
Figure 6B:
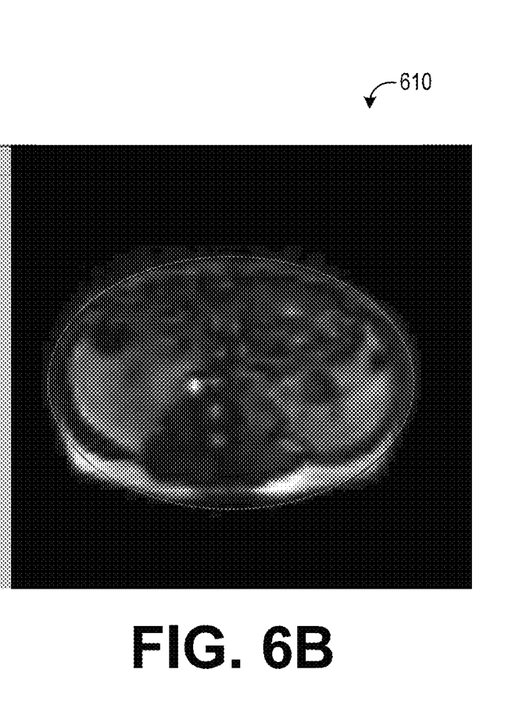

FIG. 6A illustrates an example MR signal phase shift map 600 where each pixel represents the amount of phase shift. The map of MR signal phase shift may be acquired by using a Bloch-Siegert shift. For example, the map may be acquired by applying a pulse sequence that induces a Bloch-Siegert shift, as described above. In one embodiment, a mask 602 may be applied, where the mask is shaped to match the size and shape of the bore. In another embodiment, the mask may be a localized mask based on area of interest. FIG. 6B illustrates a corresponding $B_1$ field map 610 where each pixel represents the $B_1$ field strength. The $B_1$ field strength may be derived from the MR phase shift according to known relationship between the $B_1$ field strength and MR phase shift. With the mask 602 being applied, the $B_1$ field strength values lying outside the mask are removed prior to further processing of the $B_1$ field map.

At 508, a mean flip angle (R) is determined from the $B_1$ field map. The $B_1$ field map includes a $B_1$ field strength value for each pixel in imaging space of the desired slice (e.g., a center slice located in a center of the bore), as described above. For each pixel, a corresponding flip angle may be calculated based on the $B_1$ field strength. For example, the flip angle may be calculated according to the following equation:

$$\varphi = \gamma B_1 T$$

Where $\varphi$ is the flip angle, $\gamma$ is the gyromagnetic ratio, and T is the duration of the RF pulse. The mean flip angle (R) may then be calculated by averaging all the calculated flip angles. In some embodiments, a mean $B_1$ field strength value may be determined by averaging values of the $B_1$ field strength for each pixel, and then calculating the mean flip angle from the mean $B_1$ field value.

At 510, a delta in transmit attenuation (ΔTA), otherwise referred to as the TA error, is determined based on a prescribed flip angle (R0) and mean flip angle (R). The prescribed flip angle (R0) may be the flip angle that is desired for the upcoming imaging scan based on the anatomy being scanned and/or scanning protocol (e.g., diagnostic goal of the scan). The flip angle depends on the $B_1$ field strength. In some embodiments, the reference value of TA discussed above may be selected in order to produce the prescribed flip angle. However, because the $B_1$ field depends on the loading of the transmit RF coils, which varies from patient to patient, the reference value of TA may not necessarily generate the prescribed flip angle. Thus, the actual flip angle derived from the $B_1$ field map is used to adjust the transmit attenuation in order to achieve the prescribed flip angle. In one example, ΔTA may be determined based on the equation:

$$\Delta TA = -200 * \log 10(R/R0)$$

The above equation converts the ratio of the actual flip angle to the expected flip angle into decibels (specifically, tenths of decibels), but other equations are possible depending on how the transmit attenuation is represented. As an example, using the above equation, if the prescribed flip angle is 20° and the measured mean flip angle is 24.47°, the ΔTA will be approximately −18 (−1.8 dB).

At 512, method 500 includes determining a final value of TA based on the reference value of TA and ΔTA. For example, the final TA may be calculated by correcting the reference TA with ΔTA. In the above example, if the reference value of TA was 191 (19.1 dB), the final value of TA may be 173 (17.1 dB).

At 514, an imaging scan is performed using the corrected, final TA. For example, the gain of the amplifier may be adjusted to the final value of TA in order to generate a $B_1$ field strength that results in the prescribed flip angle being reached. During the imaging scan, MR signals are obtained (e.g., by the receive RF coils) in response to RF pulses applied by the transmit RF coils, and one or more images may be reconstructed from the obtained MR signals.

In this way, one or more transmit RF pulses are applied to an imaging subject from a transmit RF coil during an imaging scan in order to generate MR signals that may be received by one or more receive RF coils. The received MR signals are then used to generate one or more images of the imaging subject. The transmit RF coil may be driven at a power output that is determined based on a mean flip angle measured from a two-dimensional B1 field map. For example, the transmit RF coil may be configured with a maximum power output and the transmit RF coil may be driven with a power output that is less than the maximum power output. The power output at which the RF coil is actually driven is determined from the $B_1$ field map as described above, whereby the mean flip angle is measured from the $B_1$ field map and a ratio of the mean flip angle to a prescribed flip angle is used to correct a reference power output. The reference power output may be the power output used to obtain the $B_1$ field map and may be selected to achieve the prescribed flip angle.

Figure 8:
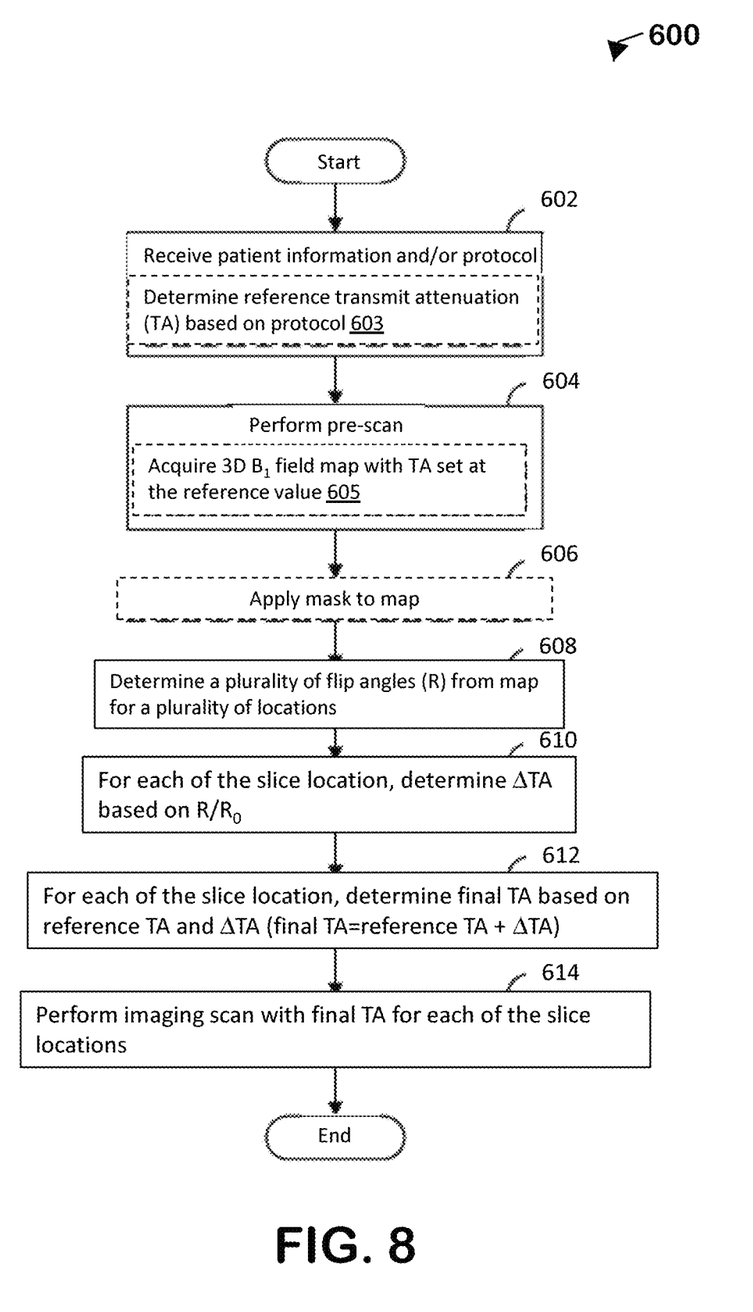
FIG. 8 is a flow chart illustrating another method for correcting transmit attenuation to be applied during an MRI scan.

FIG. 8 is a flow chart illustrating another method 600 for correcting transmit attenuation of an amplifier driving. Method 600 may be executed by controller unit 25 of FIG. 1 according to instructions stored in non-transitory memory. Similar to method 500, in method 600, at step 602, patient information and/or a scanning protocol is received. Receiving the patient information and/or scanning protocol may include, as indicated at 603, determining a reference value of transmit attenuation (TA) (or transmit gain) based on the scanning protocol and/or patient information. The reference value of TA may define the attenuation to be applied to the amplifier to reduce (e.g., attenuate) the output voltage and current used to drive the transmit RF coil(s) in order to generate a desired $B_1$ magnetic field. The desired $B_1$ magnetic field (and hence reference value of TA) may be determined based on the anatomy to be scanned as determined from the scanning protocol and/or patient information, and may be further based on the configuration of the transmit RF coil(s) (e.g., size, number, etc.). The reference value of TA may be obtained from, for example, a look-up table stored in memory of the controller unit, where the look-up table indexes reference TA to anatomy to be scanned or scanning protocol, for example.

At 604, method 600 includes performing a pre-scan. Performing the pre-scan includes acquiring a three-dimensional (3D) $B_1$ field map with transmit attenuation set at the reference value, as indicated at 605. As mentioned above, the pre-scan may be performed in order to obtain information that is usable to calibrate various aspects of the MRI system, including calibrating the transmit attenuation (or the transmit gain). To calibrate the transmit attenuation (or the transmit gain), a 3D $B_1$ field map of the body part is acquired. The 3D $B_1$ field map represents the measured strength of the $B_1$ field in the FOV of the MRI system, for each voxel location of a desired imaging space. In one embodiment, acquiring the 3D B1 field map comprises acquiring a three-dimensional map of magnetic resonance (MR) signal phase shift during a pre-scan; and deriving the three-dimensional B1 field map by converting the MR signal phase shift into corresponding B1 field strength. Further, to acquire the 3D $B_1$ field map, the MRI system may be operated according to a pulse sequence to cause the nuclei in the bore of the imaging system to undergo a Bloch-Siegert shift as explained previously in method 500. The only difference being that during the pre-scan a 3D $B_1$ field map instead of the 2D map is acquired. For example, a 3D map of the whole brain may be acquired instead of acquiring the 2D map of only the desired location in the brain.

In some examples, method 600 includes optionally, at 606, applying a mask to the $B_1$ field map in order to remove noise. For example, the mask may be circular mask sized, shaped, and positioned to correspond to the bore of the MRI system. In this way, any $B_1$ field measured outside the bore (which may correspond to noise) may be removed prior to further processing. In some embodiments, no mask is applied.

At 608, a plurality of mean flip angles (R) for a plurality of slice locations in the imaging volume is determined from the 3D $B_1$ field map. In general, the $B_1$ field map includes a $B_1$ field strength value for each voxel location in the imaging volume. It should be noted that the imaging volume is acquired during the pre-scan and includes a plurality of slices (e.g., a center slice located in a center of the bore or an off-center slice). Moreover, the pre-scan imaging volume is located in same area as the prescription scan location i.e., the user prescription. For each voxel location, a corresponding flip angle may be calculated based on the $B_1$ field strength. For example, the flip angle for one slice may be calculated according to the following equation:

$$\varphi = \gamma B_1 T$$

Where $\varphi$ is the flip angle, $\gamma$ is the gyromagnetic ratio, and T is the duration of the RF pulse. The mean flip angle (R) may then be calculated by averaging all the calculated flip angles. In some embodiments, a mean $B_1$ field strength value may be determined by averaging values of the $B_1$ field strength for each voxel location, and then calculating the mean flip angle from the mean $B_1$ field value. In similar manner, for the plurality of slice locations, multiple such mean flip angles (Rs) are determined.

At 610, for each of the slice location, a delta in transmit attenuation ($\Delta TA$), otherwise referred to as the TA error, is determined based on a prescribed flip angle (R0) and mean flip angle (R) of the respective slice location. The prescribed flip angle (R0) may be the flip angle that is desired for the upcoming imaging scan based on the anatomy being scanned and/or scanning protocol (e.g., diagnostic goal of the scan). The flip angle depends on the $B_1$ field strength. In some embodiments, the reference value of TA discussed above may be selected in order to produce the prescribed flip angle. However, because the $B_1$ field depends on the loading of the transmit RF coils, which varies from patient to patient, the reference value of TA may not necessarily generate the prescribed flip angle. Thus, the actual flip angle derived from the $B_1$ field map is used to adjust the transmit attenuation in order to achieve the prescribed flip angle. In one example, $\Delta TA$ may be determined based on the equation:

$$\Delta TA = -200 * \log 10(R/R0)$$

At 612, method 600 includes determining a final value of TA for each of the slice locations based on the reference value of TA and $\Delta TA$ for the respective slice location. For example, the final TA for a particular slice location may be calculated by adding the reference TA with $\Delta TA$ for the respective slice location.

At 614, an imaging scan is performed using the corrected, final TA. For example, based on where the imaging scan is being performed, the gain of the amplifier may be adjusted to the final value of TA near that location (determined during step 610) in order to generate a $B_1$ field strength that results in the prescribed flip angle being reached. During the imaging scan, MR signals are obtained (e.g., by the receive RF coils) in response to RF pulses applied by the transmit RF coils, and one or more images may be reconstructed from the obtained MR signals.

In this way, one or more transmit RF pulses are applied to an imaging subject from a transmit RF coil during an imaging scan in order to generate MR signals that may be received by one or more receive RF coils. The received MR signals are then used to generate one or more images of the imaging subject. The transmit RF coil may be driven at a power output that is determined based on a plurality of mean flip angles measured from a three-dimensional B1 field map. For example, the transmit RF coil may be configured with a maximum power output and the transmit RF coil may be driven with a power output that is less than the maximum power output. The power output at which the RF coil is actually driven is determined from the $B_1$ field map as described above, whereby the plurality of mean flip angles is measured from the $B_1$ field map for a plurality of locations and a ratio of the mean flip angle to a prescribed flip angle for a respective location is used to correct a reference power output. The reference power output may be the power output used to obtain the $B_1$ field map and may be selected to achieve the prescribed flip angle.

Figure 7A:
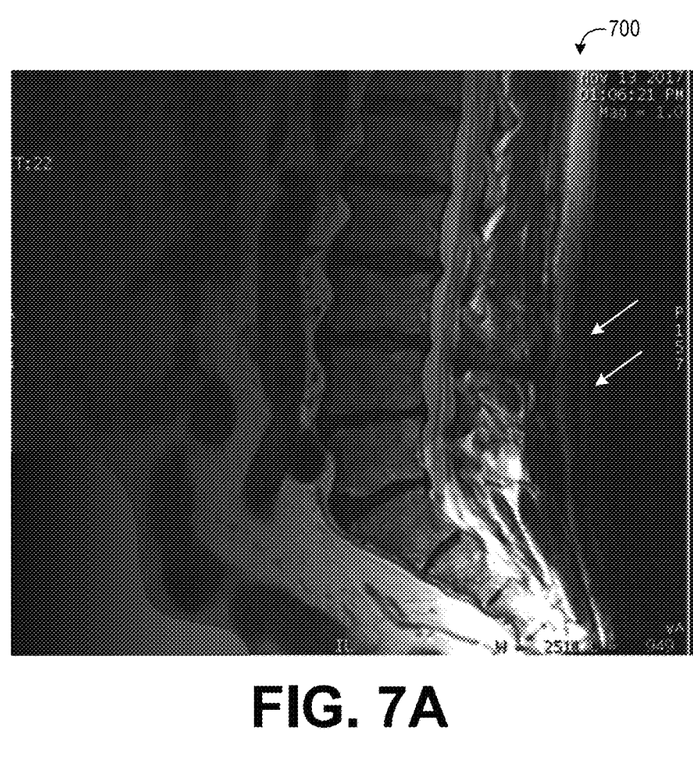
FIGS. 7A and 7B show example MR images of a spine.
Figure 7B:
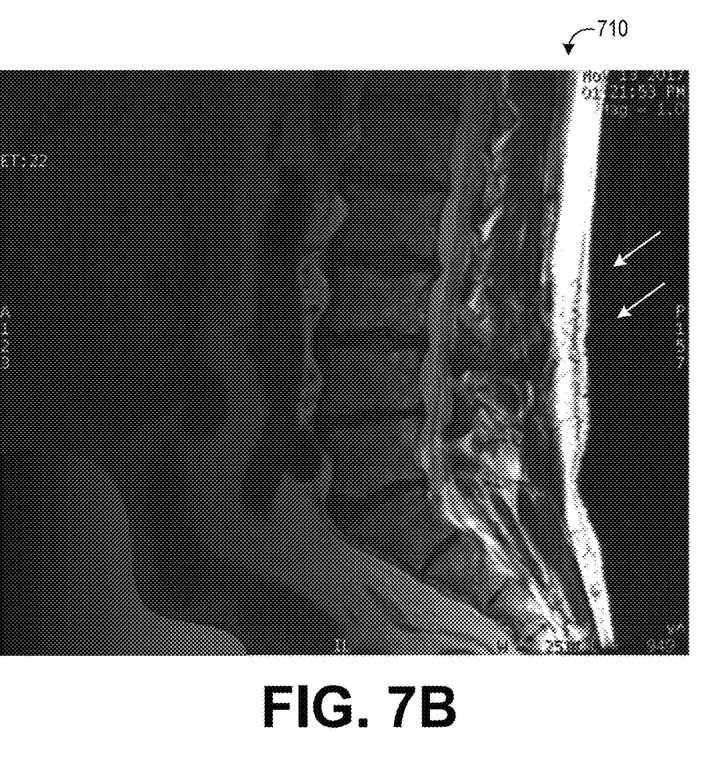

FIGS. 7A and 7B show example images reconstructed from MR signals obtained with a first transmit attenuation calculated with the phase-based method (image 700 of FIG. 7A) and from MR signals obtained with a second transmit attenuation calculated according to the method described above with respect to FIG. 5 (image 710 of FIG. 7B). Image 700 includes shading/banding artifacts in the region of the lower spine, as highlighted by the arrows. In contrast, image 710 does not include the banding artifacts and the overall brightness and contrast of the spine is increased.

The technical effect of determining a transmit attenuation for driving a transmit RF coil based on a two or three-dimensional $B_1$ field map is that the transmit attenuation determination may be less prone to error resulting from $B_1$ field inhomogeneity. Another technical effect of determining the transmit attenuation based on the two or three-dimensional B1 field map is reduction in banding artifacts in resultant MR images.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for a magnetic resonance imaging (MM) system, comprising:
    setting a reference value of transmit attenuation for an amplifier of a transmit radio frequency (RF) coil;
    acquiring a three-dimensional $B_1$ field map with the transmit attenuation set at the reference value;
    determining a plurality of mean flip angles for a plurality of slice locations in a pre-scan imaging volume from the $B_1$ field map;
    determining a transmit attenuation correction value for each of the slice locations based on a prescribed flip angle and the mean flip angle determined for the respective slice location;
    correcting the reference value of transmit attenuation with the transmit attenuation correction value at each of the slice locations to obtain a final value of transmit attenuation for each of the slice locations; and
    performing an MRI scan with the transmit attenuation set at the final value.

2. The method of claim 1, wherein acquiring the three-dimensional $B_1$ field map comprises:
    acquiring a three-dimensional map of magnetic resonance (MR) signal phase shift during a pre-scan; and
    deriving the three-dimensional $B_1$ field map by converting the MR signal phase shift into corresponding $B_1$ field strength.

3. The method of claim 2, wherein the map of MR signal phase shift is acquired by using Bloch-Siegert shift.

4. The method of claim 1, wherein the reference value of transmit attenuation is set based on one or more anatomical features of an imaging subject to be scanned.

5. The method of claim 1, wherein determining the mean flip angle for a slice location from the $B_1$ field map comprises determining a mean $B_1$ field strength represented in the $B_1$ field map and determining the mean flip angle from the mean $B_1$ field strength.

6. The method of claim 1, wherein acquiring the $B_1$ field map comprises acquiring the $B_1$ field map during the pre-scan performed prior to the MRI scan, and wherein the $B_1$ field map represents a strength of a $B_1$ field at each voxel location of the pre-scan imaging volume, the pre-scan imaging volume located in same area as a prescription scan location.

7. The method of claim 1, further comprising applying a mask to the $B_1$ field map to generate a masked $B_1$ field map, and determining the mean flip angle from the masked $B_1$ field map.

8. The method of claim 1, wherein the mask is shaped to match the size and shape of a bore of the MM system.

9. The method of claim 1, wherein the mask is a localized mask based on area of interest.

10. A magnetic resonance imaging (MRI) system, comprising:
    a transmit radio frequency (RF) coil;
    an amplifier configured to drive the transmit RF coil; and
    a controller coupled to the transmit RF coil and the amplifier, the controller configured to:
    set a reference value of transmit attenuation for the amplifier;
    acquire a three-dimensional $B_1$ field map with the transmit attenuation set at the reference value;
    determine a plurality of mean flip angles for a plurality of slice locations in a pre-scan imaging volume from the $B_1$ field map;
    determine a transmit attenuation correction value for each of the slice locations based on a prescribed flip angle and the mean flip angle determined for the respective slice location;
    correct the reference value of transmit attenuation with the transmit attenuation correction value at each of the slice locations to obtain a final value of transmit attenuation for each of the slice locations; and
    perform an imaging scan with the transmit attenuation set at the final value.

11. The system of claim 10, wherein the three-dimensional $B_1$ field map is acquired by acquiring a three-dimensional map of magnetic resonance (MR) signal phase shift during a pre-scan, and deriving the three-dimensional $B_1$ field map by converting the MR signal phase shift into corresponding $B_1$ field strength.

12. The system of claim 11, wherein the map of MR signal phase shift is acquired by using Bloch-Siegert shift.

13. The system of claim 10, wherein the reference value of transmit attenuation value is set based on one or more anatomical features of an imaging subject to be scanned.

14. The system of claim 10, wherein determining the mean flip angle for a slice location from the $B_1$ field map comprises determining a mean $B_1$ field strength represented in the $B_1$ field map and determining the mean flip angle from the mean $B_1$ field strength.

15. The system of claim 10, wherein the $B_1$ field map represents a strength of a $B_1$ field at each voxel location of the pre-scan imaging volume, the pre-scan imaging volume located in same area as a prescription scan location.

16. The system of claim 10, wherein the controller is further configured to apply a mask to the $B_1$ field map to generate a masked $B_1$ field map, and determine the mean flip angle from the masked $B_1$ field map.

17. A method for a magnetic resonance imaging (MM) system, comprising:
    setting a reference value of transmit attenuation for an amplifier of a transmit radio frequency (RF) coil;
    acquiring a $B_1$ field map with the transmit attenuation set at the reference value;
    determining a mean flip angle from the $B_1$ field map;
    determining a transmit attenuation correction value based on a prescribed flip angle and the mean flip angle;
    correcting the reference value of transmit attenuation with the transmit attenuation correction value to obtain a final value of transmit attenuation; and
    performing an MRI scan with the transmit attenuation set at the final value.

18. The method of claim 17, wherein the $B_1$ field map comprises a two dimensional (2D) $B_1$ field map or a three dimensional (3D) $B_1$ field map.

19. The method of claim 17, wherein acquiring the $B_1$ field map comprises acquiring the $B_1$ field map during the pre-scan performed prior to the MRI scan, and wherein the $B_1$ field map represents a strength of a $B_1$ field at each pixel location of an imaging plane.

20. The method of claim 19, wherein the imaging plane is located in a center of a bore of the MM system or in an off-center location of the bore of the MM system based on user prescription.

\* \* \* \* \*